(12) United States Patent
Hsu

(10) Patent No.: US 7,812,460 B2
(45) Date of Patent: Oct. 12, 2010

(54) PACKAGING SUBSTRATE AND METHOD FOR FABRICATING THE SAME

(75) Inventor: Shih-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 12/474,654

(22) Filed: May 29, 2009

(65) Prior Publication Data

US 2009/0294962 A1   Dec. 3, 2009

(30) Foreign Application Priority Data

| May 30, 2008 | (TW) | ................................ 97120141 A |
| Aug. 1, 2008 | (TW) | ................................ 97129178 A |
| Aug. 19, 2008 | (TW) | ................................ 97131530 A |

(51) Int. Cl.
  *H01L 23/48* (2006.01)
  *H01L 23/52* (2006.01)
  *H01L 29/40* (2006.01)
(52) U.S. Cl. .......................... 257/778; 257/786; 438/108
(58) Field of Classification Search ................. 257/778, 257/786, 784; 438/108, 613
  See application file for complete search history.

(56) References Cited

U.S. PATENT DOCUMENTS

| 6,445,075 | B1 * | 9/2002 | Scanlan et al. | ............... 257/778 |
| 6,779,783 | B2 * | 8/2004 | Kung et al. | ................. 257/780 |
| 6,809,262 | B1 * | 10/2004 | Hsu | ........................... 174/558 |
| 2007/0222072 | A1 * | 9/2007 | Chang et al. | ................. 257/737 |
| 2009/0308652 | A1 * | 12/2009 | Shih | ........................... 174/264 |
| 2010/0007015 | A1 * | 1/2010 | Gallegos | ..................... 257/737 |

\* cited by examiner

*Primary Examiner*—S. V Clark

(57) ABSTRACT

A packaging substrate and a method for fabricating the same are proposed, including: providing a substrate body having a first surface and an opposing second surface, wherein the first surface has a plurality of flip-chip solder pads and wire bonding pads and the second surface has a plurality of solder ball pads; forming a first and a second solder mask layers on the first and second surfaces respectively and forming openings in the first and second solder mask layers to expose the flip-chip solder pads, the wire bonding pads and the solder ball pads; forming first bumps on the flip-chip solder pads; and forming an electroless Ni/Pd/Au layer on the first bumps and the wire bonding pads by electroless plating, wherein the electroless Ni/Pd/Au layer has a thickness tolerance capable of meeting evenness requirements for fine pitch applications.

23 Claims, 6 Drawing Sheets

PACKAGING SUBSTRATE AND METHOD FOR FABRICATING THE SAME

BACKGROUND OF THE INVENTION

1. Field of the Invention

The present invention relates generally to packaging substrates and methods for fabricating the same, and more particularly, to a packaging substrate with a reinforced electrical connection structure and a method for fabricating the same.

2. Description of Related Art

Along with the rapid development of electronic industries, electronic products are becoming lighter, thinner, shorter and smaller. There is a trend towards high-performance, high-functionality, and high-speed electronic products. In a conventional semiconductor package structure, an inactive surface of a semiconductor chip is attached to a packaging substrate and an active surface of the semiconductor chip is electrically connected to the packaging substrate through bonding wires. Alternatively, the active surface of the semiconductor chip can be electrically connected to the packaging substrate by flip-chip technique. Further, a plurality of solder balls are mounted on the back side of the packaging substrate so as to electrically connect the semiconductor chip to a printed circuit board.

FIG. 1 is a sectional view of a conventional packaging substrate, wherein both wire bonding and flip-chip techniques are used for electrically connecting semiconductor chips to the packaging substrate. As shown in FIG. 1, first, a substrate body 10 having a first surface 10a and an opposing second surface 10b is provided, wherein on the first surface 10a are a plurality of flip-chip solder pads 101 and wire bonding pads 102, and the second surface 10b has a plurality of solder ball pads 103 thereon. A first solder mask layer 11a and a second solder mask layer 11b are formed on the first and second surfaces 10a, 10b, respectively. A plurality of first openings 110a, second openings 111a and third openings 110b are formed in the first and second solder mask layers 11a, 11b for exposing the flip-chip solder pads 101, the wire bonding pads 102 and the solder ball pads 103, respectively. A surface treatment layer 12 is formed on the wire bonding pads 102 and the solder ball pads 103. Solder bumps 13 are formed on the flip-chip solder pads 101. The surface treatment layer 12 is an electroplated or electroless Ni/Au layer, and the solder bumps are made of SnPb, SnAg, SnCu, or SnAgCu. Alternatively, only a surface treatment layer (not shown) made of organic solderability preservative (OSP) coatings, immersion tin (IT) or a solder material is formed on the flip-chip solder pads 101.

A first semiconductor chip 14a is mounted on the flip-chip solder pads 101 through the solder bumps 13. The first semiconductor chip 14a has an active surface 141a and an inactive surface 142a. A plurality of first electrode pads 143a are disposed on the active surface 141a and connected to the solder bumps 13 through a plurality of conductive bumps 144 such that the first semiconductor chip 14a is flip-chip electrically connected to the substrate body 10.

Further, a second semiconductor chip 14b is mounted on the first semiconductor chip 14a when the inactive surface 142b of the second semiconductor chip 14b is coupled to the inactive surface 142a of the first semiconductor chip 14a by a bonding material 15 provided therebetween. A plurality of second electrode pads 143b are disposed on an active surface 141b of the second semiconductor chip 14b and electrically connected to the wire bonding pads 102 by conductive wires 16 made of gold (Au). Further, a molding material 17 is formed to cover the first solder mask layer 11a, the wire bonding pads 102, the conductive wires 16, and the first and second semiconductor chips 14a, 14b for protection.

However, owing to the trend towards increasingly compact electronic devices, the pitches between the flip-chip solder pads 101, the wire bonding pads 102 and the solder ball pads 103 are continuously decreasing. Also, the diameter of the first and third openings 110a, 110b decreases relatively, and the exposed area of the flip-chip solder pads 101 and the solder ball pads 103 also decreases, thereby resulting in reduced bonding area between the flip-chip solder pads 101 and the solder bumps 13 as well as the solder ball pads 103 and solder balls (not shown). Further, with the flip-chip solder pads 101, the wire bonding pads 102 and the solder ball pads 103 being generally made of copper, the surface treatment layer 12 and the solder bumps 13 have to meet a lead-free soldering requirements, the surface treatment layer 12 and the solder bumps 13 face the following problems that may adversely affect the electrical connection reliability.

Firstly, with the surface treatment layer 12 being made of a solder material (SnPb, SnAg, SnCu, SnAgCu), immersion tin or OSP, it is difficult to prevent copper migration that may otherwise cause a short circuit. Further, along with the continuous increase of the thickness of an IMC (intermetallic compound) layer formed at the Sn—Cu interface, the thickness of the flip-chip solder pads 101 and the solder ball pads 103 continuously decreases, thereby adversely affecting the joint reliability.

Secondly, the surface treatment layer 12 which is an electroplated Ni/Au layer does not have fine-pitch applications for failure to meet evenness requirements for the fine-pitch applications. With the surface treatment layer 12 being formed on the flip-chip solder pads 101 or solder ball pads 103, the solder bumps 13 or solder balls readily come off the surface treatment layer 12. With the surface treatment layer 12 being formed on the wire bonding pads 102, the conductive wires 16 readily come off the surface treatment layer 12.

Thirdly, with the surface treatment layer 12 made of electroless Ni/Au being formed on the flip-chip solder pads 101 or the solder ball pads 103, the solder bumps 13 or solder balls readily come off the surface treatment layer because of the characteristics of Ni. Therefore, the surface treatment layer cannot be applied to hand-held products. If the surface treatment layer is formed on the wire bonding pads 102, there will be poor attachment between the Au layer and the conductive wires 16 because the Au layer formed by electroless plating is quite thin and structurally weak.

Fourthly, if the solder bumps 13 are formed by screen printing, a fine pitch cannot be achieved because the average size and height tolerance of the solder bumps 13 cannot be controlled well enough. If the solder bumps 13 are formed on the flip-chip solder pads 101 and the average size or height of the solder bumps 13 is small, an underfill process can be adversely affected. On the other hand, large average size or height of the solder bumps 13 is conducive to providing a solder bridge which is likely to cause a short circuit. In addition, given large height tolerance of the solder bumps 13, chips can easily be damaged due to uneven joint stresses caused by poor coplanarity.

Therefore, the semiconductor industry is in dire need of a solution to overcome the above drawbacks.

SUMMARY OF THE INVENTION

To overcome the above drawbacks, an objective of the present invention is to provide a packaging substrate and a method for fabricating the same such that integrated wire bonding and flip-chip packages can meet requirements for fine-pitch applications.

Another objective of the present invention is to provide a packaging substrate and a method for fabricating the same so as to improve the electrical connection reliability.

In order to attain the above and other objectives, the present invention provides a packaging substrate, which comprises: a substrate body having a first surface and an opposing second surface, wherein a plurality of flip-chip solder pads and wire bonding pads are provided on the first surface and a plurality of solder ball pads are provided on the second surface, a first solder mask layer and a second solder mask layer are respectively disposed on the first surface and the second surface, the first solder mask layer has a plurality of first openings for exposing the flip-chip solder pads, further has a plurality of second openings for exposing the wire bonding pads and the first surface thereabout, and the second solder mask layer has a plurality of third openings for exposing the solder ball pads, respectively; a plurality of first bumps disposed on the flip-chip solder pads; and an electroless Ni/Pd/Au layer disposed on the first bumps and the wire bonding pads.

In the above-described packaging substrate, the first bumps are made of copper, and the width of the first bumps is greater than or equal to the diameter of the first openings of the first solder mask layer. Each of the first bumps further has a recess portion.

The packaging substrate further comprises a first conductive layer disposed between the flip-chip solder pads and the first bumps. The first conductive layer comprises a palladium material, but the first surface exposed from the second openings is free of the residual palladium material.

In addition, the above-described packaging substrate further comprises a plurality of second bumps made of copper, disposed on the solder ball pads, and covered by the electroless Ni/Pd/Au layer. A second conductive layer is disposed between the second bumps and the solder ball pads, and each of the second bumps has a recess portion.

The present invention further provides a method for fabricating a packaging substrate. The method comprises the steps of: providing a substrate body having a first surface and an opposing second surface, with a plurality of flip-chip solder pads and wire bonding pads disposed on the first surface, a plurality of solder ball pads disposed on the second surface, and a first solder mask layer and a second solder mask layer disposed on the first surface and the second surface, respectively; forming in the first solder mask layer a plurality of first openings for exposing the flip-chip solder pads and a plurality of second openings for exposing the wire bonding pads and the first surface thereabout, and forming in the second solder mask layer a plurality of third openings for exposing the solder ball pads, respectively; forming a first conductive layer on the first solder mask layer, the flip-chip solder pads, the wire bonding pads and the first surface of the substrate body; forming a first resist layer and a second resist layer on the first conductive layer and the second solder mask layer, respectively, and forming a plurality of first openings in the first resist layer to expose the first conductive layer on the flip-chip solder pads; forming a plurality of first bumps on the first conductive layer in the first openings of the first resist layer by electroplating; removing the second resist layer, the first resist layer, and the first conductive layer covered by the first resist layer; and forming an electroless Ni/Pd/Au layer on the first bumps and the wire bonding pads by electroless plating.

In the above-described method, the first bumps can be made of copper, and the width of the first bumps is greater than or equal to the diameter of the first openings of the first solder mask layer. Each of the first bumps further has a recess portion.

The first conductive layer formed comprises a palladium material which functions as a catalyst for metal deposition so as to facilitate the formation of the first conductive layer on the first solder mask layer, the flip-chip solder pads, the wire bonding pads and the first surface of the substrate body. The above-described method further comprises removing the first resist layer and the first conductive layer covered by the first resist layer, and performing a micro-etching process that uses an etching solution containing cyanide (CN) or thiourea (($NH_2$)$_2$CS)) so as to completely remove the palladium material, thereby ensuring the first surface exposed from the second openings of the first solder mask layer to be free of the residual palladium material.

In addition, in the above-described method, the electroless Ni/Pd/Au layer can be formed on the solder ball pads by electroless plating. Alternatively, a plurality of second bumps made of copper are formed on the solder ball pads by electroplating, and the electroless Ni/Pd/Au layer is formed on the second bumps by electroless plating. Each of the second bumps has a recess portion.

The fabrication method of the second bumps further comprises: forming a second conductive layer on the second solder mask layer and the solder ball pads; forming a second resist layer on the second conductive layer, and forming second openings in the second resist layer so as to expose the second conductive layer on the solder ball pads; forming the second bumps on the second conductive layer in the second openings of the second resist layer by electroplating; and removing the second resist layer and the second conductive layer covered by the second resist layer.

Compared with the conventional electroplated Ni/Au layer, the electroless Ni/Pd/Au layer of the present invention is helpful to prevent copper migration so as to prevent a short circuit. Meanwhile, the electroless Ni/Pd/Au layer formed by electroless plating has a thickness tolerance capable of meeting evenness requirements for fine pitch applications. Further, the electroless Ni/Pd/Au layer applied to the flip-chip solder pads or solder ball pads and even the first and second bumps can prevent detachment of solder bumps or solder balls. In addition, the electroless Ni/Pd/Au layer formed on the wire bonding pads can facilitate the wire bonding process.

Furthermore, instead of using the conventional screen printing, the present invention forms the first bumps by electroplating. Thus, the average size and height tolerance are easy to control so as to overcome the conventional problems of underfilling difficulty, joint bridge and uneven joint stresses caused by poor coplanarity of the bumps. The recess portions of the first bumps further alleviate stresses between the semiconductor chips and the packaging substrate.

Therefore, the packaging substrate of the present invention improves the electrical connection reliability and makes integrated wire bonding and flip-chip packages capable of meeting requirements for fine pitch applications.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

First Embodiment

FIGS. 2A to 2E are sectional views showing a packaging substrate and a method for fabricating the same according to a first embodiment of the present invention.

Figure 1:
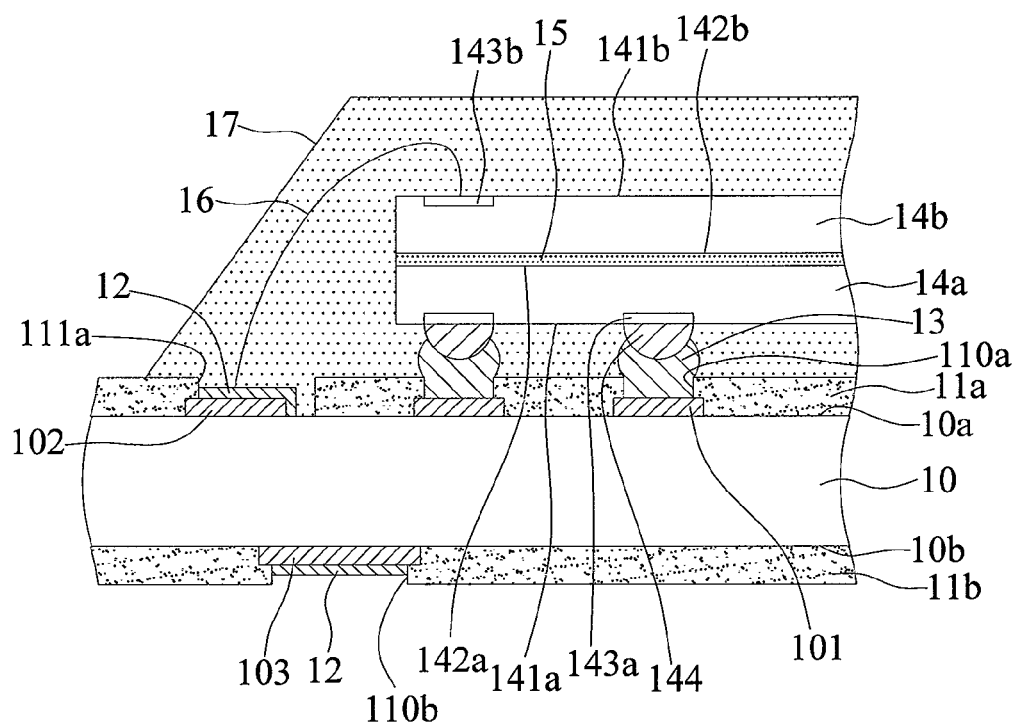
FIG. 1 is a sectional view of a conventional packaging substrate and semiconductor chips.
Figure 2A:
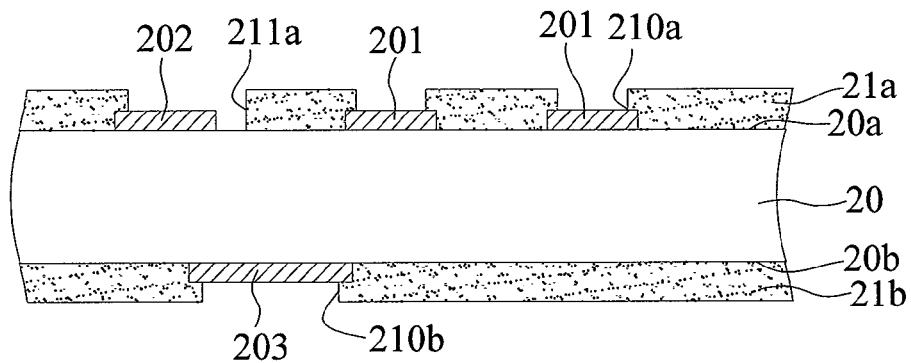
FIGS. 2A to 2E are sectional views showing a packaging substrate and a method for fabricating the same according to a first embodiment of the present invention, wherein FIG. 2D' is a partial enlarged view of FIG. 2D, and FIG. 2E" and FIG. 2E' shows other embodiments of FIG. 2E.

As shown in FIG. 2A, a substrate body 20 having a first surface 20a and an opposing second surface 20b is provided. A plurality of flip-chip solder pads 201 and wire bonding pads 202 are formed on the first surface 20a. A plurality of solder ball pads 203 are formed on the second surface 20b. A first solder mask layer 21a and a second solder mask layer 21b are formed on the first surface 20a and the second surface 20b, respectively. A plurality of first openings 210a and second openings 211a are formed in the first solder mask layer 21a so as to allow the flip-chip solder pads 201 to be exposed from the first openings 210a and allow the wire bonding pads 202 as well as the first surface 20a around the wire bonding pads 202 to be exposed from the second openings 211a. A plurality of third openings 210b are formed in the second solder mask layer 21b so as to expose the solder ball pads 203.

Figure 2B:
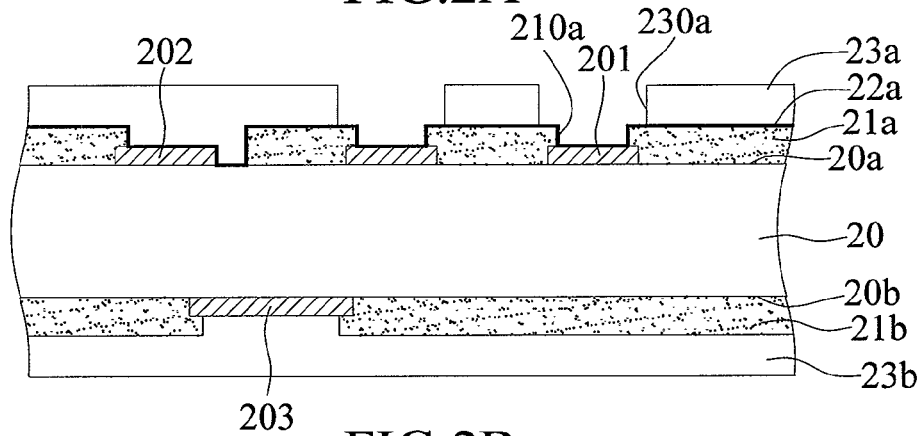

As shown in FIG. 2B, a first conductive layer 22a is formed on the first solder mask layer 21a, the flip-chip solder pads 201, the wire bonding pads 202 and the first surface 20a of the substrate body 20. The first conductive layer 22a comprises a palladium material which functions as a catalyst for metal deposition, thereby facilitating the formation of the first conductive layer 22a on the first solder mask layer 21a, the flip-chip solder pads 201, the wire bonding pads 202 and the first surface 20a of the substrate body 20.

Next, a first resist layer 23a is formed on the first conductive layer 22a, and a second resist layer 23b is formed on the second solder mask layer 21b. A plurality of first openings 230a are formed in the first resist layer 23a to expose the first conductive layer 22a on the flip-chip solder pads 201 and on the first solder mask layer 21a around the flip-chip solder pads 201.

Figure 2C:
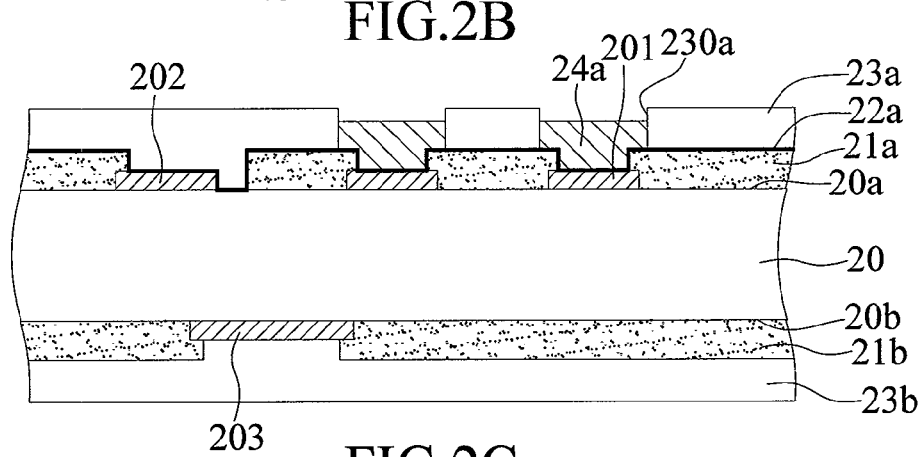

As shown in FIG. 2C, a plurality of first bumps 24a made of copper are formed on the first conductive layer 22a in the first openings 230a of the first resist layer 23a by electroplating.

Figure 2D:
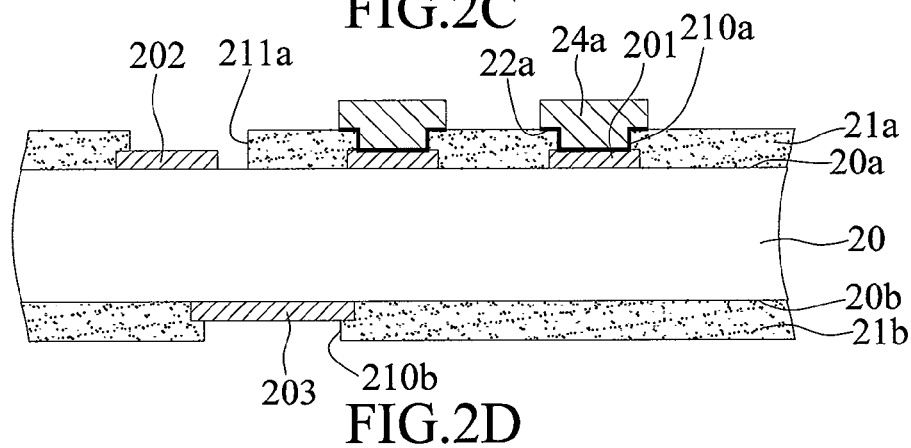
Figure 2D:
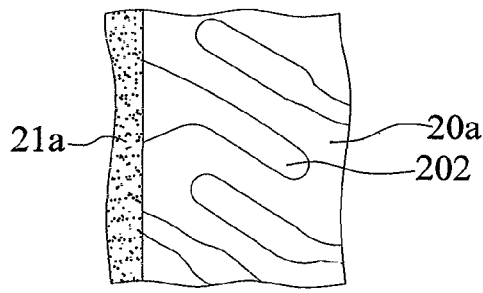

As shown in FIG. 2D, the first resist layer 23a and the first conductive layer 22a covered by the first resist layer 23a are removed to expose the first solder mask layer 21a, the first bumps 24a, the wire bonding pads 202 and the first surface 20a around the wire bonding pads 202. Meanwhile, the second resist layer 23b is removed to expose the second solder mask layer 21b and the solder ball pads 203.

Further referring to FIG. 2D', after the first conductive layer 22a covered by the first resist layer 23a is removed, the palladium material may be left on the first surface 20a around the wire bonding pads 202 in the second openings 211a of the first solder mask layer 21a. Thus, when an electroless Ni/Pd/Au layer is formed on the wire bonding pads 202 in a subsequent process, the electroless Ni/Pd/Au layer is also formed on the first surface 20a due to the residual palladium material thereon, thereby resulting in bridging between the wire bonding pads 202 and a short circuit. To overcome the drawback, the residual palladium material on the first surface 20a around the wire bonding pads 202 in the second openings 211a is completely removed through a micro-etching process that uses an etching solution containing cyanide (CN) or thiourea ($(NH_2)_2CS$).

Figure 2E:
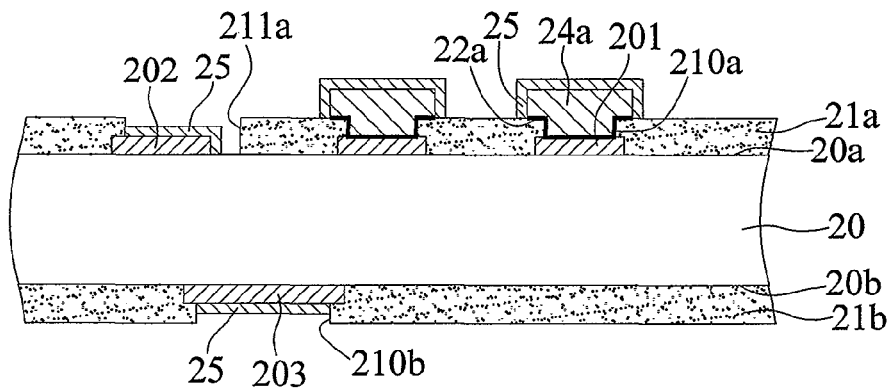
Figure 2E:
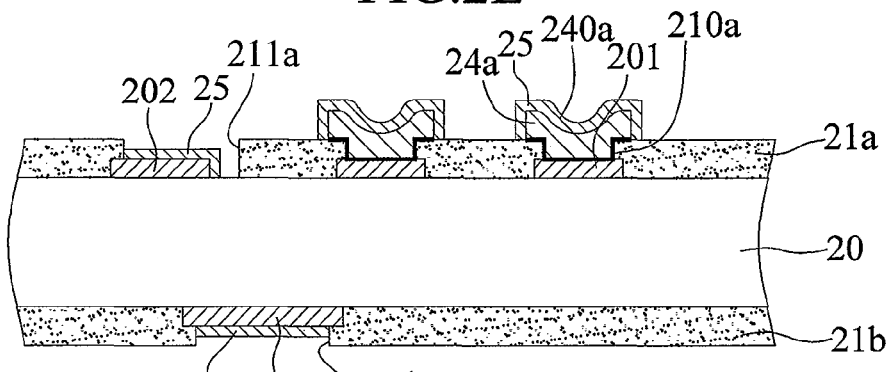
Figure 2E:
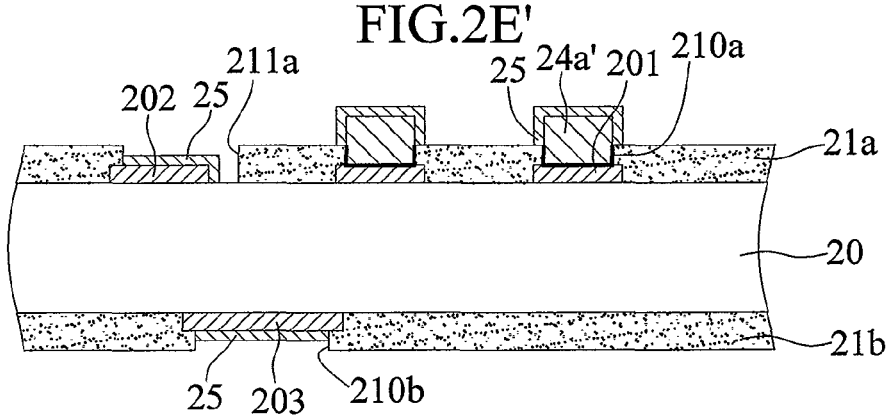

As shown in FIG. 2E, an electroless Ni/Pd/Au layer 25 (with Au formed outermost) is formed on the first bumps 24a, the wire bonding pads 202 and the solder ball pads 203 by electroless plating. The width of the first bumps 24a is greater than the diameter of the first openings 210a of the first solder mask layer 21a.

As shown in FIG. 2E', each of the first bumps 24a has a recess portion 240a. Alternatively, as shown in FIG. 2E", the width of the first bumps 24a' is equal to the diameter of the first openings 210a of the first solder mask layer 21a. Further, an electroless Ni/Pd/Au layer 25 is formed on an exposed surface of the first bumps 24a, 24a' of FIGS. 2E' and 2E".

The present invention further provides a packaging substrate. As shown in FIG. 2E, the packaging substrate comprises a substrate body 20 having a first surface 20a and an opposing second surface 20b. A plurality of flip-chip solder pads 201 and wire bonding pads 202 are disposed on the first surface 20a. A plurality of solder ball pads 203 are disposed on the second surface 20b. A first solder mask layer 21a and a second solder mask layer 21b are disposed on the first surface 20a and the second surface 20b, respectively. A plurality of first and second openings 210a, 211a are disposed in the first solder mask layer 21a for exposing the flip-chip solder pads 201 and the wire bonding pads 202, respectively. A plurality of third openings 210b are disposed in the second solder mask layer 21b for exposing the solder ball pads 203. A plurality of first bumps 24a are made of copper and disposed on the flip-chip solder pads 201. An electroless Ni/Pd/Au layer 25 (with Au formed outermost) is disposed on the first bumps 24a, the wire bonding pads 202 and the solder ball pads 203.

The packaging substrate further comprises a first conductive layer 22a disposed between the flip-chip solder pads 201 and the first bumps 24a, wherein the first conductive layer 22a comprises a palladium material, but the first surface 20a exposed from the second openings 211a of the first solder mask layer 21a is free of the residual palladium material.

In addition, the width of the first bumps 24a is greater than the diameter of the first openings 210a of the first solder mask layer 21a (as shown in FIG. 2E) or equal to the diameter of the first openings 210a (as shown in FIG. 2E"), and each of the first bumps 24a has a recess portion 240a (as shown in FIG. 2E').

Second Embodiment

FIGS. 3A to 3D are cross-sectional views of a packaging substrate and a method for fabricating the same according to a second embodiment of the present invention. The second embodiment differs from the first embodiment in that, in the second embodiment, a plurality of second bumps are formed on the solder ball pads.

Figure 3A:
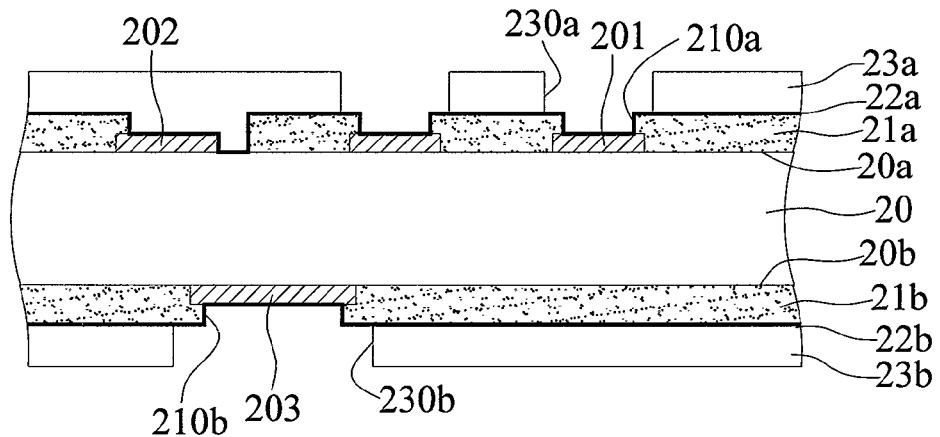
FIGS. 3A to 3D are sectional views showing a packaging substrate and a method for fabricating the same according to a second embodiment of the present invention, wherein FIG. 3D' shows another embodiment of FIG. 3D.

As shown in FIG. 3A, a structure as shown in FIG. 2A is provided. Then, a first conductive layer 22a is formed on the first solder mask layer 21a, the flip-chip solder pads 201, the wire bonding pads 202 and the first surface 20a of the substrate body 20, wherein the first conductive layer 22a comprises a palladium material. A first resist layer 23a is formed on the first conductive layer 22a. A plurality of first openings 230a are formed in the first resist layer 23a to expose the first conductive layer 22a on the flip-chip solder pads 201 and around the flip-chip solder pads 201. A second conductive layer 22b is formed on the second solder mask layer 21b and the solder ball pads 203. A second resist layer 23b is formed on the second conductive layer 22b. A plurality of second openings 230b are formed in the second resist layer 23b to expose the second conductive layer 22b on the solder ball pads 203 and around the solder ball pads 203.

Figure 3B:
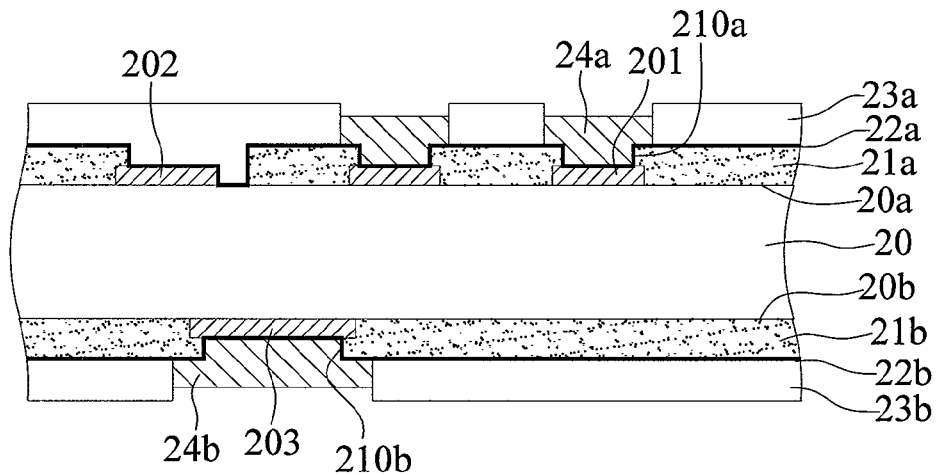

As shown in FIG. 3B, a plurality of first bumps 24a made of copper are formed on the first conductive layer 22a in the first openings 230a of the first resist layer 23a by electroplating, and a plurality of second bumps 24b made of copper are formed on the second conductive layer 22b in the second openings 230a of the second resist layer 23b by electroplating.

Figure 3C:
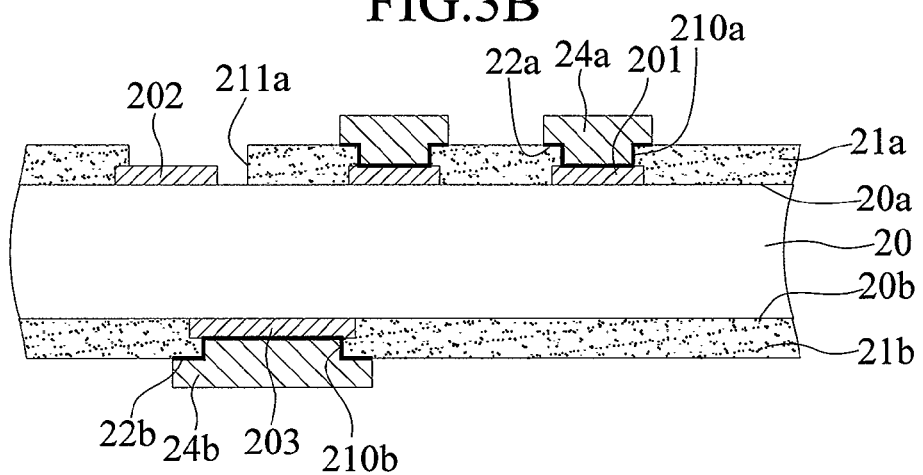

As shown in FIG. 3C, the first resist layer 23a and the first conductive layer 22a covered by the first resist layer 23a are removed to expose the first solder mask layer 21a, the first bumps 24a, the wire bonding pads 202 and the first surface 20a around the wire bonding pads 202. Meanwhile, the second resist layer 23b is removed to expose the second solder mask layer 21b and the second bumps 24b. The residual palladium material on the first surface 20a around the wire bonding pads 202 in the second openings 211a of the first solder mask layer 21a is completely removed by a microetching process that involves using an etching solution containing cyanide (CN) or thiourea (($NH_2$)$_2$ CS).

Figure 3D:
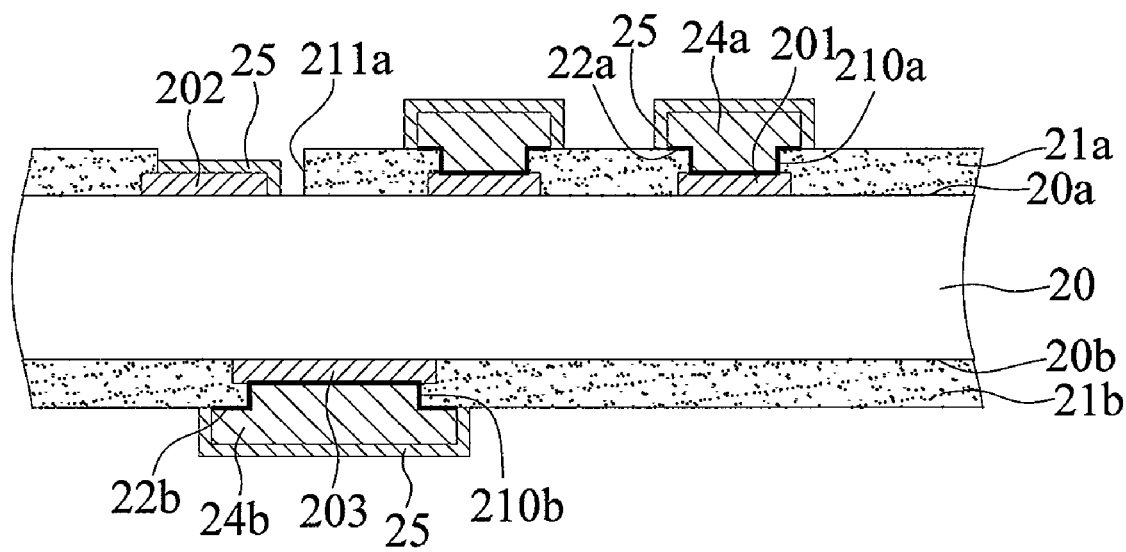
Figure 3D:
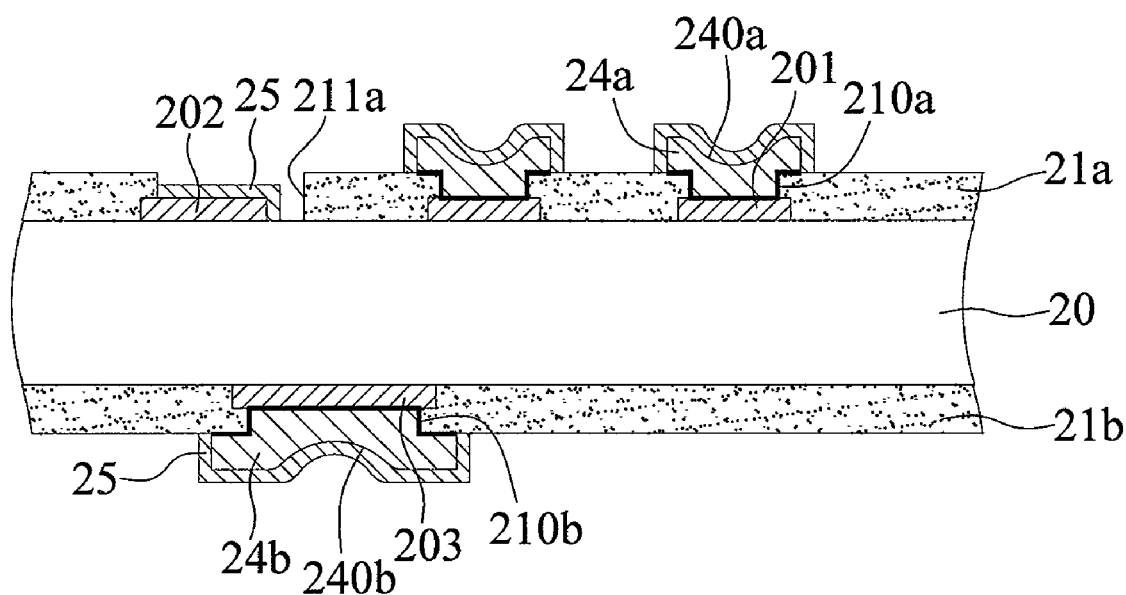

As shown in FIG. 3D, an electroless Ni/Pd/Au layer 25 (with Au formed outermost) is formed on the first bumps 24a, the wire bonding pads 202 and the second bumps 24b by electroless plating. As shown in FIG. 3D', each of the second bumps 24b has a recess portion 240b.

The present invention further provides a packaging substrate. As shown in FIG. 3D, the packaging substrate comprises a substrate body 20 having a first surface 20a and an opposing second surface 20b, wherein a plurality of flip-chip solder pads 201 and wire bonding pads 202 are disposed on the first surface 20a, and a plurality of solder ball pads 203 are disposed on the second surface 20b. A first solder mask layer 21a and a second solder mask layer 21b are disposed on the first surface 20a and the second surface 20b, respectively. A plurality of first and second openings 210a, 211a are disposed in the first solder mask layer 21a for exposing the flip-chip solder pads 201 and the wire bonding pads 202, respectively. A plurality of third openings 210b are disposed in the second solder mask layer 21b for exposing the solder ball pads 203. A plurality of first bumps 24a are made of copper and disposed on the flip-chip solder pads 201. A plurality of second bumps 24b are made of copper and disposed on the solder ball pads 203. An electroless Ni/Pd/Au layer 25 (with Au formed outermost) is disposed on the first bumps 24a, the wire bonding pads 202 and the second bumps 24b.

The packaging substrate further comprises a first conductive layer 22a disposed between the flip-chip solder pads 201 and the first bumps 24a, wherein the first conductive layer 22a comprises a palladium material, but the first surface 20a exposed from the second openings 211a is free of the residual palladium material. The packaging substrate further comprises a second conductive layer 22b disposed between the second bumps 24b and the solder ball pads 203.

In addition, the width of the first bumps 24a is greater than the diameter of the first openings 210a of the first solder mask layer 21a (as shown in FIGS. 3D and 3D') or equal to the diameter of the first openings 210a (not shown), and each of the first bumps 24a has a recess portion 240a (as shown in FIG. 3D'). Also, the width of second bumps 24b is greater than the diameter of the third openings 210b (as shown in FIGS. 3D and 3D') or equal to the diameter of the third openings 210b (not shown), and each of the second bumps 24b has a recess portion 240b (as shown in FIG. 3D').

Figure 4:
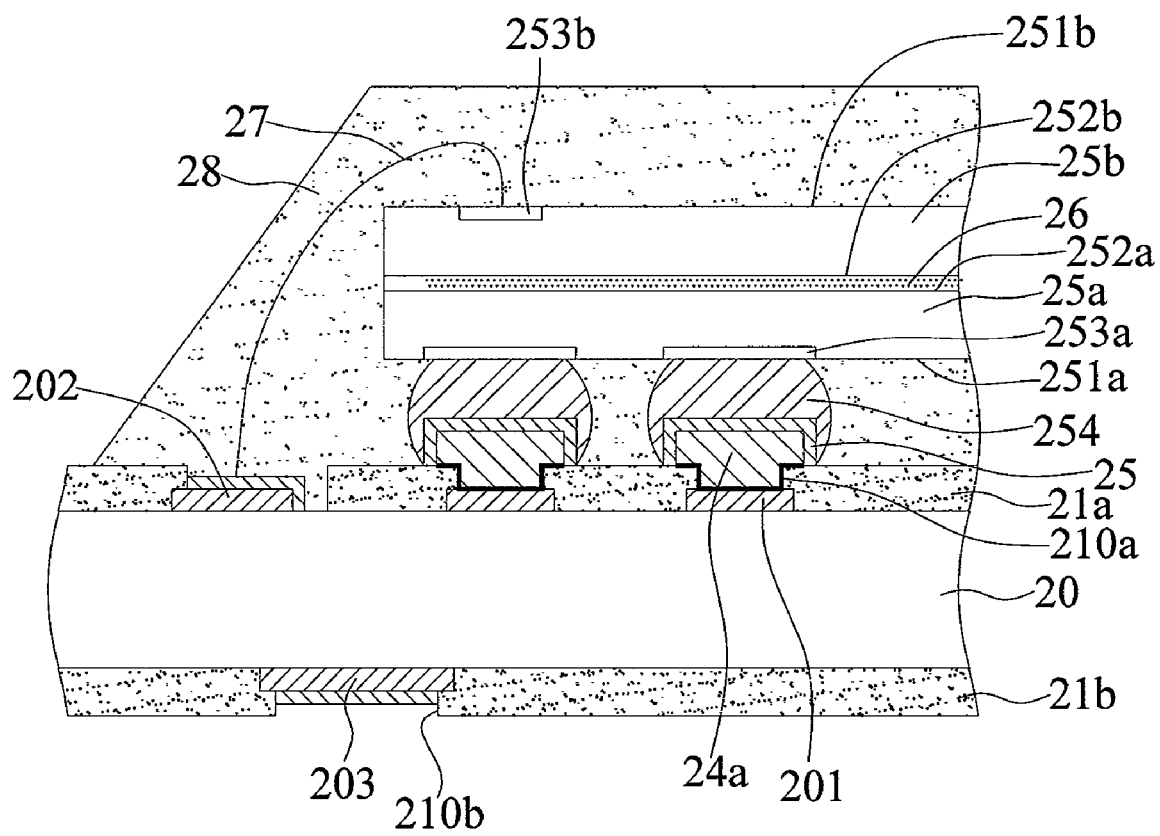
FIG. 4 is a sectional view of a package structure with the packaging substrate and semiconductor chips of the present invention.

Referring to FIG. 4, a first semiconductor chip 25a is mounted on the first bumps 24a on the flip-chip solder pads 201, wherein the first semiconductor chip 25a has an active surface 251a and an opposing inactive surface 252a. A plurality of first electrode pads 253a are disposed on the active surface 251a. Conductive bumps 254 are disposed on the electrode pads 253a such that the first electrode pads 253a are connected to the first bumps 24a through the conductive bumps 254, thereby flip-chip electrically connecting the first semiconductor chip 25a to the substrate body 20.

In addition, a second semiconductor chip 25b with an active surface 251b and an inactive surface 252b is provided. The second semiconductor chip 25b is mounted on the first semiconductor chip 25a when the inactive surface 252b of the second semiconductor chip 25b is coupled to the inactive surface 252a of the first semiconductor chip 25a by a bonding material 26 provided therebetween. A plurality of second electrode pads 253b are disposed on the active surface 251b of the second semiconductor chip 25b and electrically connected to the wire bonding pads 202 through conductive wires 27 made of metal such as gold (Au). A molding material 28 is disposed to cover the first solder mask layer 21a, the wire bonding pads 202, the conductive wires 27, and the first and second semiconductor chips 25a, 25b for protection.

According to the present invention, the electroless Ni/Pd/Au layer 25 is helpful to prevent copper migration so as to prevent a short circuit. Further, with the electroless Ni/Pd/Au layer 25 being disposed between copper and tin, a high temperature reflow process produces a uniform IMC layer characterized advantageously by evenness and a low thickness-increasing speed, thereby ensuring a high electrical joint quality.

Further, compared with the conventional electroplated Ni/Au layer, the electroless Ni/Pd/Au layer 25 formed by electroless plating has a thickness tolerance that meets evenness requirements for fine pitch applications. The electroless Ni/Pd/Au layer 25 applied to the flip-chip solder pads 201 or solder ball pads 203 and even the first bumps 24a, 24a' and the second bumps 24b prevents detachment of the conductive bumps 254 or solder balls (not shown). In addition, the electroless Ni/Pd/Au layer 25 formed on the wire bonding pads 202 facilitates the wire bonding process.

Furthermore, instead of using the conventional screen printing, the present invention forms the first bumps 24a, 24a' and the second bumps 24b by electroplating. Thus, the average size and height tolerance are easy to control so as to overcome the conventional problems of the underfilling difficulty, joint bridge and uneven joint stresses caused by poor coplanarity of the bumps. The recess portions 240a of the first bumps 24a further alleviate stresses between the semiconductor chips and the packaging substrate.

Therefore, according to the present invention, the design of the electroless Ni/Pd/Au layer and the first bumps not only improves the electrical connection reliability but also enables integrated wire bonding and flip-chip packages to meet requirements for fine pitch applications.

The above-described descriptions of the detailed embodiments illustrate the preferred implementation according to the present invention but do not limit the scope of the present invention. Accordingly, all modifications and variations made by those with ordinary skill in the art should fall within the scope of present invention defined by the appended claims.

What is claimed is:

1. A packaging substrate, comprising:
a substrate body with a first surface having a plurality of flip-chip solder pads and wire bonding pads provided on the first surface and an opposing second surface having a plurality of solder ball pads provided on the second surface, the first surface having a first solder mask layer disposed thereon, the second surface having a second solder mask layer disposed thereon, the first solder mask layer having a plurality of first openings for exposing the flip-chip solder pads and further having a plurality of second openings for exposing the wire bonding pads and the first surface thereabout, and the second solder mask layer having a plurality of third openings for exposing the solder ball pads, respectively;
a plurality of first bumps disposed on the flip-chip solder pads; and
an electroless Ni/Pd/Au layer disposed on the first bumps and the wire bonding pads.

2. The packaging substrate of claim 1, wherein the width of the first bumps is greater than or equal to the diameter of the first openings of the first solder mask layer.

3. The packaging substrate of claim 1, wherein each of the first bumps has a recess portion.

4. The packaging substrate of claim 1, wherein the first bumps are made of copper.

5. The packaging substrate of claim 1, further comprising a first conductive layer disposed between the flip-chip solder pads and the first bumps.

6. The packaging substrate of claim 5, wherein the first conductive layer comprises a palladium material, the palladium material being absent from the first surface exposed from the second openings.

7. The packaging substrate of claim 1, wherein the electroless Ni/Pd/Au layer is disposed on the solder ball pads.

8. The packaging substrate of claim 7, further comprising a plurality of second bumps disposed on the solder ball pads and covered by the electroless Ni/Pd/Au layer.

9. The packaging substrate of claim 8, further comprising a second conductive layer disposed between the second bumps and the solder ball pads.

10. The packaging substrate of claim 8, wherein each of the second bumps has a recess portion.

11. The packaging substrate of claim 8, wherein the second bumps are made of copper.

12. A method for fabricating a packaging substrate, comprising the steps of:
providing a substrate body having a first surface and an opposing second surface, with a plurality of flip-chip solder pads and wire bonding pads disposed on the first surface, a plurality of solder ball pads disposed on the second surface, and a first solder mask layer and a second solder mask layer disposed on the first surface and the second surface, respectively;
forming in the first solder mask layer a plurality of first openings for exposing the flip-chip solder pads and a plurality of second openings for exposing the wire bonding pads and the first surface thereabout, respectively, and forming in the second solder mask layer a plurality of third openings for exposing the solder ball pads, respectively;
forming a first conductive layer on the first solder mask layer, the flip-chip solder pads, the wire bonding pads and the first surface of the substrate body;
forming a first resist layer and a second resist layer on the first conductive layer and the second solder mask layer, respectively, and forming a plurality of first openings in the first resist layer to expose the first conductive layer on the flip-chip solder pads;
forming a plurality of first bumps on the first conductive layer in the first openings of the first resist layer by electroplating;
removing the second resist layer, the first resist layer, and the first conductive layer covered by the first resist layer; and
forming an electroless Ni/Pd/Au layer on the first bumps and the wire bonding pads by electroless plating.

13. The method of claim 12, wherein the first bumps are of a width greater than or equal to a diameter of the first openings of the first solder mask layer.

14. The method of claim 12, wherein each of the first bumps has a recess portion.

15. The method of claim 12, wherein the first bumps are made of copper.

16. The method of claim 12, wherein the first conductive layer comprises a palladium material functioning as a catalyst for metal deposition so as to facilitate the formation of the first conductive layer on the first solder mask layer, the flip-chip solder pads, the wire bonding pads and the first surface of the substrate body.

17. The method of claim 16, further comprising removing the first resist layer and the first conductive layer covered by the first resist layer, and removing the palladium material completely by a micro-etching process using an etching solution containing cyanide (CN) or thiourea ((NH2)2CS)), thereby allowing the first surface exposed from the second openings of the first solder mask layer to be free of the residual palladium material.

18. The method of claim 12, further comprising forming the electroless Ni/Pd/Au layer on the solder ball pads by electroless plating.

19. The method of claim 12, further comprising forming a plurality of second bumps on the solder ball pads by electroplating.

20. The method of claim 19, wherein the forming the plurality of second bumps comprises the steps of:
forming a second conductive layer on the second solder mask layer and the solder ball pads;
forming a second resist layer on the second conductive layer, and forming second openings in the second resist layer so as to expose the second conductive layer on the solder ball pads;
forming the second bumps on the second conductive layer in the second openings of the second resist layer by electroplating; and
removing from the second solder mask layer the second resist layer thereon and the second conductive layer covered by the second resist layer.

21. The method of claim 19, further comprising forming the electroless Ni/Pd/Au layer on the second bumps by electroless plating.

22. The method of claim 19, wherein each of the second bumps is formed with a recess portion.

23. The method of claim 19, the second bumps are made of copper.

* * * * *